United States Patent [19]
Milnes et al.

[11] 3,993,533
[45] Nov. 23, 1976

[54] METHOD FOR MAKING SEMICONDUCTORS FOR SOLAR CELLS

[75] Inventors: Arthur G. Milnes, Pittsburgh; Donald L. Feucht, Wilkins Township, Allegheny County, both of Pa.

[73] Assignee: Carnegie-Mellon University, Pittsburgh, Pa.

[22] Filed: Apr. 9, 1975

[21] Appl. No.: 566,308

[52] U.S. Cl................................. 156/613; 156/614; 156/624; 156/17; 427/86; 427/87; 29/580; 29/582
[51] Int. Cl.²...................... B01J 17/00; B01J 17/30
[58] Field of Search................... 264/104, 334, 335; 156/247, 344, 600, 604, 605, 606, 610, 613, 614, 17, 624; 427/74, 76, 82, 85, 86, 87, 344, 350; 29/580, 582

[56] References Cited
UNITED STATES PATENTS

| | | | |
|---|---|---|---|
| 3,366,516 | 1/1968 | McAleer | 156/613 |
| 3,621,565 | 11/1971 | Sandstrom | 156/17 |
| 3,645,823 | 2/1972 | Merk | 156/344 |
| 3,655,496 | 4/1972 | Ettre | 156/155 |
| 3,846,198 | 11/1974 | Wen | 156/17 |
| 3,847,686 | 12/1974 | Stein | 156/17 |

*Primary Examiner*—Michael F. Esposito
*Attorney, Agent, or Firm*—Buell, Blenko & Ziesenheim

[57] ABSTRACT

The invention relates to a method for producing a desired thin semiconductor film for use in solar cells. The desired semiconductor is grown epitaxially on a second semiconductor film which may be epitaxial on a third semiconductor. The second semiconductor has a lower melting point than the desired semiconductor. The temperature of the second semiconductor is increased. This creates a molten state in the second semiconductor and the desired semiconductor is stripped away from the second semiconductor. The desired film may be detached by dissolving the second semiconductor with a chemical agent that dissolves the second semiconductor.

26 Claims, 6 Drawing Figures

METHOD FOR MAKING SEMICONDUCTORS FOR SOLAR CELLS

This invention relates to a method for making thin semiconductor film for use in solar cells. More particularly, this method relates to a new method for fabricating single crystal films of silicon or other semiconductors in the range of 1 to 50 micrometers for use in solar cells. Such films, produced at low cost, offer the possibility of providing np junctions or Schottky barrier metal-n semiconductor junctions for cheap photovoltaic solar cells for the direct generation of electrical energy from sunlight.

PRIOR ART AND THE PROBLEM PRESENTED TO THE INVENTORS

Present methods of fabricating solar cells involve the growth of single crystal ingots or tapes of silicon from a melt but these processes are high in cost. Experimental work under study for reducing cost involve the use of less Si by the condensation of a thin Si layer from the pyrolytic decomposition of $SiHCl_3$ or $SiH_4$, or related compounds, onto cheap substrates to create a thin film layer of Si for subsequent fabrication into solar cells. But such methods do not produce cells of good conversion efficiency (electrical energy divided by thermal energy) since the Si is almost always highly polycrystalline and of low minority carrier lifetime ($10^{-10} - 10^{-8}$ sec.) due to recombination centers and impurities associated with the crystal structure. Lifetimes in the range $10^{-5} - 10^{-6}$ sec. are required for Si solar cells of acceptable efficiency, 5%–10% and higher.

The polycrystallinity is associated with the nature of the substrate and the lattice mismatch between the substrate and the Si layer at the deposition temperature which is typically in the range 900°–1200° C for the $SiHCl_3$ decomposition process. It is also difficult to find a cheap substrate that will withstand these temperatures and not interact with the Si in a way harmful to the development of a semiconductor layer of good minority carrier lifetime. For instance if thin iron sheet is the substrate, there is a tendency for Fe-Si compounds to form. If a copper sheet is used, there are troublesome Cu-Si compounds formed and in any case Cu is a lifetime destroyer in Si. If a molybdenum substrate is used, the silicon is polycrystalline and cracking may occur even though the thermal expansion coefficient mismatch is less between these two materials than most metal silicon combinations. A further objection to polycrystalline Si films is that impurity migration down grain boundaries may occur during subsequent processing steps, such as diffusion, and harm the cell performance.

THE INVENTORS' SOLUTION TO THE PROBLEM

The present invention describes a new technique for the fabrication of thin films of single crystal, or substantially single crystal, such as silicon or gallium arsenide or related semiconductors, that are of semiconductor quality suitable for solar cells and which are readily manufactured at a low cost. The inventors term this technique "peeled film technology" (PFT). During the fabrication of the film the semiconductor junction required may also be formed or it may be added later. The junction may alternatively take the form of a semitransparent thin metal film of a metal such as Al, Au, Ag, Pt, Pd, Ni, Cu, that is known to form a Schottky rectifying junction on silicon, gallium arsenide or related semiconductors.

The invention is of particular promise because it will solve a major problem, namely that of finding a production method for low-cost silicon solar cells. There are several competing approaches at present but all have problems that may or may not be resolvable.

The cells involved could be large in area, for example, 20 cm long × 6 cm wide and be 15–20 $\mu$m thick. Such a cell at an efficiency of 10% would produce about 1 watt (peak). It is conceptually possible to produce such a finished cell at a cost of less than $1 per watt in large scale production.

Though Si is a brittle material in slices 4 to 15 mils, this is not true of thin Si foils less than 1 mil thick. We have seen strain gauges that can be wrapped around a 1 cm diameter rod. So there is no concern about the handling of the films if moderate care is taken.

Calculations that have been made by others suggest that 10% efficiency should be achieved in layers only 20 $\mu$m thick, if the minority carrier lifetime is reasonable, in spite of the somewhat low photon-absorption coefficients in silicon (see Fang et al. Applied Physics Letters 25, p.583, 1974). The carrier lifetimes should be good because we expect almost single-crystal Si and a reasonably acceptable dislocation count.

We provide a method for producing a desired thin semiconductor film for use in solar cells comprising growing epitaxially the desired semiconductor film on a second semiconductor film having a lower melting point than the desired semiconductor film; increasing the temperature of the second semiconductor to create a molten state; and then detaching the desired semiconductor.

We preferably provide a method for producing a desired thin semiconductor film for use in solar cells comprising growing epitaxially the desired semiconductor film on a second semiconductor film which has been epitaxially grown on a third semiconductor, the second semiconductor having a lower melting point than the desired film and the third semiconductor; increasing the temperature of the second semiconductor to create a molten state; and then detaching the desired semiconductor film.

DESCRIPTION OF A PREFERRED EMBODIMENT OF THE INVENTION

While we have shown certain objects, purposes and advantages of this invention, other objects, purposes and advantages will become apparent as the following description of the present preferred embodiment proceeds.

Figure 1:
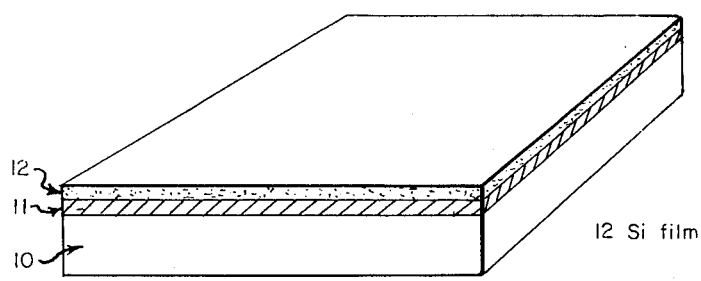
Figure 2:
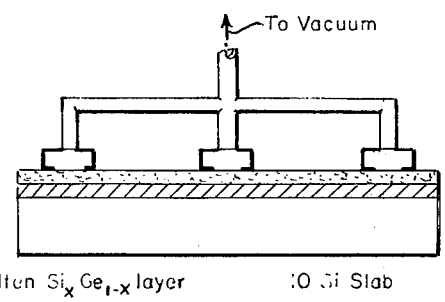
Figure 3:
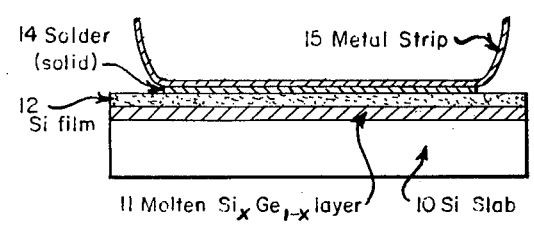
Figure 4:
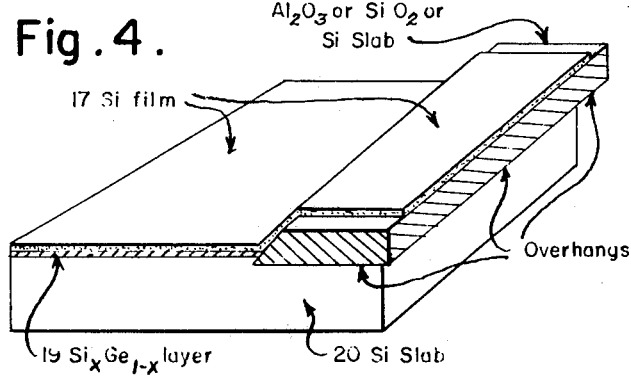
Figure 5:
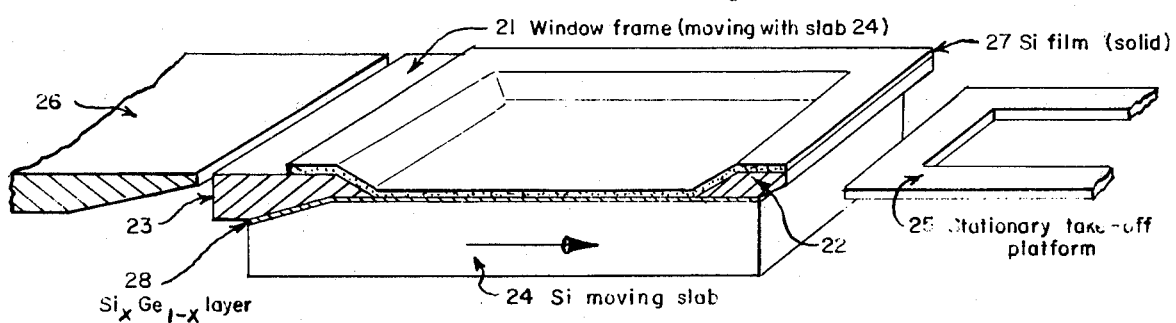
Figure 6:
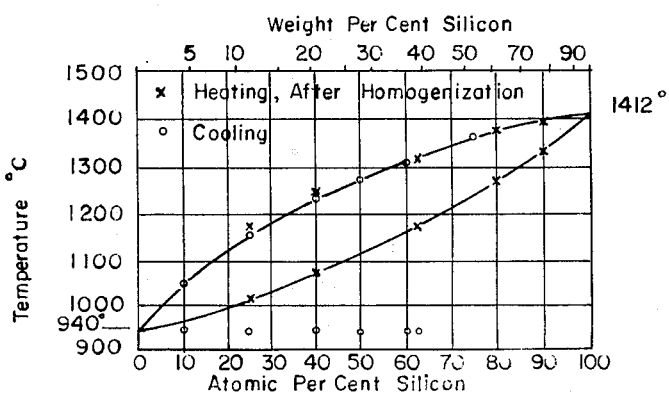

In the accompanying drawings, we have shown a present preferred embodiment of the invention in which:

FIG. 1 is a schematic diagram of the invention;
FIG. 2 is a schematic diagram of the invention;
FIG. 3 is a schematic diagram of the invention;
FIG. 4 is a schematic diagram of the invention;
FIG. 5 is a schematic diagram of the invention; and
FIG. 6 is an equilibrium metallurgical phase diagram between germanium (Ge) and silicon (Si).

FIG. 1 shows a slab of single crystal silicon 10 rectangular in shape and having dimensions of 20 cm long by 6 cm wide by 0.5 cm thick. On the top face of the slab 10 a single crystal, or nearly single-crystal, layer of germanium or $Si_xGe_{1-x}$ alloy (where x may have values from 0 to 0.8) 11 has been grown having a thickness from 0.05 to 5 μm, but preferably of about 0.5 μm. This layer is single crystal because it has been nucleated by the clean, oxide-free, single-crystal surface of the silicon that matches the lattice constant and crystalline structure (cubic-face-centered diamond structure) of the silicon-germanium to within 4%. Under such conditions of close lattice match it is well known that single crystal epitaxy occurs. Up to 80% Si may be included in the $Si_xGe_{1-x}$ layer to improve lattice match conditions and to allow a high temperature of deposition of the Si layer 12 to permit good single crystal epitaxy. This single crystal layer may have been produced in one of many ways that are known art for the production of germanium or silicon-germanium layers on germanium or silicon seeds. Preferred techniques include the thermal decomposition of $GeH_4$, $GeHCl_3$, $GeCl_4$, $GeH_2Cl_2$, $GeH_3Cl$, $SiH_4$, $SiHCl_3$, $SiCl_4$, $SiH_2Cl_2$, and $SiH_3Cl$, in a stream of gas, such as $H_2$ or He or Ar, at temperatures in the range 700° to 1,300° C. The growth of $Si_xGe_{1-x}$ single crystal layers on Si seeds from a mixed stream of $GeCl_4$, $SiCl_4$ and $H_2$ has been described by Miller and Grieco (J. Electrochemical Soc. 109, p. 70 (1962)). Also, there has been further work by Lyutovich, et al., (Sov. Physics — Crystallography 15, p. 1109 (1971)) and others over a substantial range of values of x.

Some techniques involve the growth of germanium and silicon from iodine or bromine compounds of Ge and Si such as $GeI_2$ by disproportionation into $GeI_4$ and Ge at temperatures in the range 400° to 700° C. Yet other techniques include the passage of the Si slab through a molten bath of Ge or Ge-Si, or a bath of Ge dissolved in Sn or Ga or Pb, or such a bath containing both Ge and Si. Yet other techniques involve evaporation or sputtering of germanium or germanium and silicon.

On top of the Ge or $Si_xGe_{1-x}$ layer 11 has been grown a single, or substantially single crystal, layer of silicon 12 having a thickness from 1 to 50 μm. The layer is single crystal because it has been epitaxially grown on the single-crystal $Si_xGe_{1-x}$ layer. This single-crystal Si layer may have been produced in one of many ways that are known art for the production of silicon layers on silicon seed crystals. The preferred techniques include the thermal decomposition of $SiHCl_3$ or $SiH_4$ or $SiCl_4$, or $SiH_2Cl_2$ or $SiH_3Cl$ in a stream of gas such as $H_2$ or He or Ar at temperatures in the range 700° to 1,200° C, but preferably below the melting point of the $Si_xGe_{1-x}$ alloy. Other techniques include the thermal decomposition of the analogous iodine and bromine compounds of silicon with hydrogen. Other techniques of depositing the Si can involve evaporation of Si or sputtering.

The silicon layer 12 can be removed from the structure by raising the temperature for a short period above the melting point of the intermediate layer 11. The silicon 12 does not melt because its melting point is 1,420° C. Since the silcon-germanium alloy is molten at some temperature in the range above 960° to 1,350° C the silicon layer 12 can be lifted (detached) off by a vacuum "pick-off" or by any attachment that may have been made to it. It may be pushed off by a probe or it may even slip off under its own weight if the slab is tilted and if the intermediate layer is sufficiently liquid and of low viscosity.

A preferred form of the invention is one in which a vacuum chuck is brought down in contact with the silicon layer 12. The vacuum chuck would need to be made of a high melting point material (greater than the melting point of the intermediate layer) such as Mo, stainless steel or Ta. The vacuum chuck moves the silicon film to where it is cooled and front and back contacts are placed on it. The geometry of the vacuum chuck may take many forms, of which one is illustrated in FIG. 2, and may include flexible links.

During the growth of the $Si_xGe_{1-x}$ and Si layers, dopants may be added to the deposition process so that the semiconductor properties are convenient for subsequent fabrication of a solar cell from the Si layer. For instance in the deposition of the $Si_xGe_{1-x}$ and Si layers diborane can be added to the gas stream to produce p type boron-doped layers and phosphine or arsine to produce n type phosphorous or arsenic doped layers. Thus one structure would consist of the $Si_xGe_{1-x}$ layer 11 heavily p doped and the Si layer 12 lightly p doped except for the final top surface of the layer (0.1 to 3 μm deep) which is n doped to form a pn junction in the silicon 12. The heavily p doped layer of $Si_xGe_{1-x}$ that is residual on the underside of the pSi film after peeling is helpful in assuring good ohmic contact to the Si film. Another structure would consist of a heavily doped n $Si_xGe_{1-x}$ layer on which is nSi followed by a thin pSi layer, or by a thin Schottky barrier of Pt or Au.

In another form of the invention the silicon seed 10 in FIG. 1 is a long thin Si dendrite web ribbon or a Tyco-type EFG ribbon.

FIG. 3 shows a cross-section of another embodiment of the invention, just before peeling, in which the Si film 12 is attached to a metal strip 15 such as Mo, Be, Ta, Fe strip by means of a solder 14 that is slid and strong above the melting point of the intermediate layer 11 but which is molten at a temperature below the melting point of Si. In this embodiment the metal strip 15 would be brought in contact with the Si 12 when the solder 14 was molten. The temperature must then be dropped to a lower level such as 1,050° or 1,100° C so that the solder 14 freezes and firmly attaches the metal strip 15 to the silicon layer 12. The silicon layer 12 can then be detached, or peeled, from the slab at any temperature between the melting point of the solder 14 say 1,100° C and the melting point of the $Si_xGe_{1-x}$ layer 11. The slab 10 of seed silicon with its residual germanium coating can then be reused to seed the growth of further intermediate and Si layers. The metal strip 15 is of window-frame shape so that when it is carrying the silicon film solar cell, it serves as a front (top) contact to the np junction and allows the sunlight to reach most of the front (top face) of the cell.

FIG. 4 shows another embodiment of the invention in which a different mechanical means for detaching the silicon film 17 is illustrated. Here a small slab 18 of single crystal $Al_2O_3$ or $SiO_2$ or Si has been laid overhanging across one edge of the silicon seed block 20 after the $Si_xGe_{1-x}$ layer 19 has been grown. The Si layer 17 is then grown at a temperature just below the melting point of the $Si_xGe_{1-x}$ layer 19. The temperature is then raised to make the $Si_xGe_{1-x}$ 19 molten and the Si film 17 is detached by lifting the small slab 18 using the overhang feature. After the Si film 17 is further processed into a solar cell the slab 18 is detached and reused as a matter of economy. The taper shown on the slab 18 is a feature that improves the epitaxy of the Si film 17 in this region and also reduces the strain in the Si film 17 during the detaching process. Many variations of the geometry of the slab 18 are included in the invention. For instance, the part might be a windowframe structure slightly larger than the Si substrate 20 to provide more complete support of the Si film during and after detachment. The advantage of making part of the slab 18 of Si is that the epotaxy of the Si film is improved. On the other hand the cleaning of part 18 before reuse is made easier if the material is $Al_2O_3$ or $SiO_2$ since the residual Si and Ge can be etched off in acids that do not greatly affect the $Al_2O_3$ or $SiO_2$ or other material the slab is made of. A picture-frame version of part 18 of FIG. 4 is shown as frame 21 in FIG. 5. This particular design is shown in partial cross-section and has a ramp shaped leading edge 22 and rear edge 23 matched by a chamfer on the Si substrate slab 24. As the silicon substrate slab 24 moves to the right, the leading edge 22 rides up over a take-off platform 25 helped by pressure from the following force frame 26. The effect of the ramped edges 22 and 23 is that there is a clean lift-off of the silicon film 27 and by suitable overhang design it can be arranged that the main part of the Si film 27 is not scarred during release from the molten $Si_xGe_{1-x}$ film 28 and during and after the take-off process. The ramp edges 22 and 23 need not be of the same slope, but can be chosen so that a smooth peeling action of the film is obtained.

It may be questioned to what extent the $Si_xGe_{1-x}$ and Si film and block interalloy during the period when the intermediate layer is made molten as part of the take-off processes of FIGS. 2, 3, 4 and 5. The extent of this interalloying depends on the times and temperatures involved and on the equilibrium metallurgical phase diagram between Ge and Si. This diagram is given as FIG. 6 and to those skilled in the reading such diagrams it will be apparent that if the thickness of the $Si_xGe_{1-x}$ film is much less than that of the Si film (say 0.5 $\mu$m Ge compared with 15 $\mu$m Si), and if the temperatures of contact or take-off are not far above the melting point of the $Si_xGe_{1-x}$ layer, then relatively little thickness of Si will be alloyed with the Ge. Hence, the Si film will not be noticeably thinned by these processes and the substrate block surface (10 in FIG. 1) will not deteriorate rapidly and will require minimal cleaning before each reuse.

Although the invention has been described with reference to the growth and detaching of a Si film it is equally appropriate for the growth and detaching of single crystal or near single crystal films of GaAs or $GaAs_xP_{1-x}$ or GaP, or $Al_yGa_{1-y}As$. The lattice match of GaAs is almost identical with that of Ge and the melting point of GaAs is 1,240° C so that Ge can be made molten (MP 960° C) for the detaching process. The GaAs film could be grown by interacting Ga, $GaCl_3$ and $AsH_3$ or $AsCl_3$, or by flash evaporation or any other known-art process that does not damage the Ge film. It may be observed that Ge is a very slow diffuser in GaAs and, therefore, will not seriously dope the GaAs film during growth. The seed slab (such as 10 in FIG. 1) for the growth of a GaAs film could, for example, be GaAs or Si single crystal material. If the slab is GaAs the epitaxy tends to be more perfect than if it is Si.

In the same way using Ge or $Si_xGe_{1-x}$ as a release agent as in FIG. 1, single crystal films of $GaAs_xP_{1-x}$, GaP and $Al_xGa_{1-x}As$ can be grown. All these semiconductors have lattice constants within about 4% of that of Ge and melting points above that of the release agent.

The method is limited in materials only by the requirement that layer 11 shall have a lower melting point than layer 12 on the slab 10; and that preferably materials 10, 11 and 12 shall have closely similar lattice constants so that the epitaxy by known-art methods shall be good and single crystal or nearly so. For example InP could be used for either the third semiconductor or the desired semiconductor film with an intermediate layer of lower melting point such as Ge or InAs.

In an alternate version of the invention the desired thin semiconductor film 12 (FIG. 1) is detached by dissolving the second semiconductor film 11 in a chemical agent that dissolves it more readily than the desired film 12 and the third semiconductor 10.

ADDITIONAL EXAMPLES

Further Examples that may be used to illustrate the nature of the invention are:

EXAMPLE 1

The production of CdTe thin film can be accomplished by release from an intermediate layer of InsB (melting point 530° C) grown on a substrate of single crystal CdTe. The lattice constants are CdTe 6.477A and Insb 6.479. The CdTe has a melting point of 1,098° C, and a very low vapor pressure at 530° C so any tendency to sublimation will be low.

EXAMPLE 2

The production of CdSe thin film can be accomplished by release from an intermediate layer of GaSb on a substrate of single crystal CdSe. CdSe is hexagonal but has one plane with a lattice constant 4.3 $\sqrt{2}$ (=6.06A) which is a good lattice match to the 6.09A of GaSb. The melting point of GaSb is 706° C. CdSe has a melting point of 1,239° C but sublimes at a much lower temperature. However, CdSe may be able to withstand 706° C in a suitable atmosphere without film deterioration.

EXAMPLE 3

The production of AlSb thin film can be accomplished by release from an intermediate layer of GaSb grown on a single crystal seed of AlSb or on a single crystal of InAs. The melting points are AlSb 1,065° C, GaSb 706° C, InAs 942° C. The lattice constants are AlSb 6.136A, GaSb 6.095A and InAs 6.058A.

The bandgaps of the semiconductors mentioned above are CdTe 1.44eV (indirect gap); CdSe 1.7eV (direct gap) and Alsb 1.6eV (indirect gap). All three of these materials have potential for solar cell use.

EXAMPLE 4

The technique of seeded film growth and detachment by melting of the intermediate layer 11 (FIG. 1) is applicable to the growth and detachment of thin films of binary, ternary and quaternary semiconductors composed of elements of columns II, III, IV, V and VI of the atomic periodic chart. Examples would be ZnSe, $Si_yGe_{1-y}$, $CdTe_ySe_{1-y}$, $ZnS_ySe_{1-y}$, $CdZn_ySe_{1-y}$, $CdSe_{y-}S_{y-y}$, $Ga_yIn_{1-y}P$, $Al_yGa_{1-y}As_zP_{1-z}$, $Al_yGa_{1-y}As_zSb_{1-z}$, $Si_yGe_{1-y}As$. Such semiconductors are selected for use on the basis of desirable bandgaps, mobilities, lifetimes, lattice constants, electron affinities, thermal expansion coefficients, etc.

EXAMPLE 5

The technique illustrated in FIG. 1 is applicable also to the fabrication and detachment of multiple semiconductor layers. For instance, layer 12 of FIG. 1 could be at 12 μm layer of GaAs with a 1 μm layer of $Al_xGa_{1-x}As$ on top of it epitaxially. The layer 11 which is molten in the detach process could be Ge and the seed slab could be singlecrystal GaAs. When detached, layer 12 if suitably doped would constitute a low cost high temperature GaAs solar cell with heteroface $Al_xGa_{1-x}As$ to control the surface recombination velocity.

EXAMPLE 6

The production of InP thin film can be accomplished by release from an intermediate layer of CdS on a substrate of single crystal InP using a chemical agent, $HNO_3$, to dissolve the intermediate layer. CdS is hexagonal but has one plane with a lattice constant 4.14 $\sqrt{2}$ (32 5.85A) which is a good lattice match to the 5.87A of InP. CdS is readily dissolved in $HNO_3$ while InP is not significantly attacked.

EXAMPLE 7

The production of GaAs thin film can be accomplished by release from an intermediate layer of $Al_xGa_{1-x}As$ on a substrate of single crystal GaAs using a chemical agent, HCl, to dissolve the intermediate layer. The lattice constants of these materials are a good match. $Al_xGa_{1-x}As$ is readily dissolved in HCl while GaAs is not significantly attacked.

ALTERNATE TECHNIQUES

The technique illustrated in FIG. 1 could also involve cooling the whole structure (slab 10 and layers 11 and 12) in temperature after growth for further processing before the detaching process is carried out. Then oxide processes and photo resist pattern processes and diffusions through oxide windows might be applied to layer 12 to form diffused regions or ion-implanted regions of p and n doping to achieve required device geometries for diode, transistor and related device arrays.

After these processes are completed the slab could then be raised to a temperature that makes layer 11 molten and allows the detaching process to proceed.

We claim:
1. A method for producing a desired thin semiconductor film for use in solar cells comprising:
   a. growing epitaxially the desired semiconductor film on a second semiconductor film which has been epitaxially grown on a third semiconductor, the second semiconductor film having a lower melting point than the desired semiconductor film and the third semiconductor;
   b. increasing the temperature of the second semiconductor film to create a molten state; and then
   c. detaching the desired semiconductor film.
2. A method as recited in claim 1 wherein the desired semiconductor film, the second semiconductor film and the third semiconductor have a substantial lattice match.
3. A method as recited in claim 2 wherein the desired semiconductor film is substantially a single crystal.
4. A method as recited in claim 3 wherein the desired semiconductor is a film of silicon.
5. A method as recited in claim 3 wherein the second semiconductor is selected from the group consisting of Ge and Ge-Si alloy.
6. A method as recited in claim 3 wherein the second semiconductor is Ge-Si alloy.
7. A method as recited in claim 3 wherein the desired semiconductor film contains at least one pn junction.
8. A method as recited in claim 3 in which the third semiconductor is a single crystal.
9. A method as recited in claim 3 wherein the third semiconductor is a single crystal selected from the group consisting of Si and GaAs.
10. A method as recited in claim 3 wherein the third semiconductor is a single crystal selected from the group consisting of InAs and InP.
11. A method as recited in claim 3 wherein the third semiconductor is a single crystal selected from the group consisting of CdTe and CdSe.
12. A method as recited in claim 3 wherein the desired semiconductor film contains a plurality of different semiconductors.
13. A method as recited in claim 3 wherein the second semiconductor is selected from the group consisting of Ge and Ge-Si alloy and the third semiconductor being selected from the group of Si and GaAs.
14. A method as recited in claim 3 wherein the desired semiconductor film is a crystal selected from the group consisting of GaAs, $GaAs_xP_{1-x}$, $Al_yGa_{1-y}As$, AlSb and InP.
15. A method as recited in claim 3 wherein the desired semiconductor film is a crystal selected from the group consisting of CdTe and CdSe.
16. A method as recited in claim 3 wherein the desired semiconductor film is detached by a vacuum means.
17. A method as recited in claim 3 wherein the desired semiconductor film is detached by soldering metal contacts to the desired semiconductor, the solder having a melting point between the melting point of the second semiconductor, and the other two semiconductors (first and third).
18. A method as recited in claim 3 wherein the desired semiconductor film is detached by a slab that rides off the second semiconductor and carries the desired semiconductor film with it thereby detaching the desired semiconductor film from the second semiconductor.
19. A method as recited in claim 3 wherein the desired single crystal thin semiconductor film is formed of binary, ternary and quaternary semiconductors from columns II, III, IV, V and VI of the atomic periodic chart.
20. A method for producing a desired thin semiconductor film for use in solar cells comprising:
   a. growing epitaxially the desired semiconductor film on a second semiconductor film which has been epitaxially grown on a third semiconductor film, the second semiconductor having greater solubility in a chemical agent than the desired semiconductor film and the third semiconductor;
   b. immersing the films in a chemical agent to dissolve the second semiconductor film; and then
   c. detaching the desired semiconductor film.
21. A method as recited in claim 20 wherein the desired semiconductor film is selected from the group consisting of GaAs and InP.
22. A method as recited in claim 20 wherein the second semiconductor is selected from the group consisting of CdS and $Al_xGa_{1-x}As$.
23. A method as recited in claim 20 wherein the third semiconductor is a single crystal selected from the group consisting of InP and GaAs.
24. A method as recited in claim 20 wherein the desired single crystal thin semiconductor film is formed of binary, ternary and quaternary semiconductors from columns II, III, IV, V and VI of the atomic periodic chart.

25. A method as recited in claim 20 wherein the desired semiconductor film is detached by a slab that rides off the second semiconductor during chemical dissolution and carries the desired semiconductor film with it thereby detaching the desired semiconductor film from the second semiconductor.

26. A method as recited in claim 20 wherein the desired semiconductor film is detached by a vacuum means during chemical dissolution of the second semiconductor.

* * * * *